(12) United States Patent
Yap et al.

(10) Patent No.: US 7,977,637 B1
(45) Date of Patent: Jul. 12, 2011

(54) HONEYCOMB INFRARED DETECTOR

(75) Inventors: Daniel Yap, Newbury Park, CA (US); James H. Schaffner, Chatsworth, CA (US)

(73) Assignee: HRL Laboratories, LLC, Malibu, CA (US)

( * ) Notice: Subject to any disclaimer, the term of this patent is extended or adjusted under 35 U.S.C. 154(b) by 1 day.

(21) Appl. No.: 12/544,687

(22) Filed: Aug. 20, 2009

(51) Int. Cl.
*H01L 31/0236* (2006.01)

(52) U.S. Cl. .................................................. 250/338.4

(58) Field of Classification Search .................. 250/330, 250/332, 336.1, 338.1, 338.4, 339.01, 339.02; 136/243, 244, 252, 253
See application file for complete search history.

(56) References Cited

U.S. PATENT DOCUMENTS

| | | | |
|---|---|---|---|
| 4,183,035 A | 1/1980 | Wang et al. | |
| 4,496,788 A | 1/1985 | Hamakawa et al. | |
| 4,675,525 A * | 6/1987 | Amingual et al. | 250/338.1 |
| 5,080,725 A | 1/1992 | Green et al. | |
| 5,239,179 A | 8/1993 | Baker | |
| 5,581,084 A | 12/1996 | Chapman et al. | |
| 5,721,429 A | 2/1998 | Radford et al. | |
| 5,963,790 A | 10/1999 | Matsuno et al. | |
| 6,294,723 B2 | 9/2001 | Uematsu et al. | |
| 6,545,289 B1 | 4/2003 | Gunapala et al. | |
| 6,852,920 B2 | 2/2005 | Sager et al. | |
| 6,858,462 B2 | 2/2005 | Zaidi et al. | |
| 7,545,051 B2 | 6/2009 | Yang et al. | |
| 2002/0135869 A1 | 9/2002 | Banish et al. | |
| 2004/0045932 A1 | 3/2004 | Kochergin et al. | |
| 2005/0109388 A1 | 5/2005 | Murakami et al. | |
| 2006/0251995 A1 | 11/2006 | Wille et al. | |
| 2008/0072958 A1 | 3/2008 | Dutta | |

FOREIGN PATENT DOCUMENTS

JP 05259427 A * 10/1993

OTHER PUBLICATIONS

Tokranova, N., et al.,"Hybrid Solar Cells Based on Organic Materials Embedded Into Porous Silicon," Proc. SPIE, 5724, 183-190 (2005).
Technical Information document (SD-12), Characteristics and use of infrared detectors, by Hamamatsu Photonics K. K, pp. 1-43 (2004).
A. Rogalski (Journal of Applied Physics, vol. 93, No. 8, 15, pp. 4355-4391 (2003).
Green, M.A., et al. , "Very High Efficiency Silicon Solar Cells—Science and Technology," IEEE Transactions on Electron Devices, vol. 46, No. 10, pp. 1940-1947 (1999).
Campbell, P., et al., "Light Trapping Properties of Pyramidally Textured Surfaces," J. Appl. Phys., vol. 62.1, American Institute of Physics, pp. 243-249 (1987).
Brendel, R., et al.,"Ultrathin crystalline silicon solar cells on glass substrates," Applied Physics Letters, vol. 70, No. 3, pp. 390-392 (1997).
Swanson, R. M., et al. "Point-contact silicon solar cells," IEEE Transactions on Electron Devices, vol. ED-31, No. 5, pp. 661-664 (1984).

(Continued)

*Primary Examiner* — David P Porta
*Assistant Examiner* — Marcus H Taningco
(74) *Attorney, Agent, or Firm* — Janus Law Group

(57) ABSTRACT

An absorber is disclosed. The disclosed absorber contains a base layer, and a pyramidally shaped absorbing material disposed above the base layer and configured to absorb an incident light and generate minority electrical carriers and majority electrical carrier, wherein the pyramidally shaped absorbing material defines a plurality of holes within it.

26 Claims, 15 Drawing Sheets

OTHER PUBLICATIONS

Sinton, R.A., et al., "27.5 percent silicon concentrator solar cells," IEEE Electron Device Letters, vol. EDL-7 No. 10, pp. 567-569 (1986).

Yuan, H., et al., "FPA Development: from InGaAs, InSb to HgCdTe," Proceedings of SPIE vol. 6940, paper 69403C, (2008).

Ashley, T., et al., "Epitaxial InSb for elevated temperature operation of large IR focal plane arrays," Proceedings of SPIE vol. 5074, pp. 95-102 2003).

Zhao,, et al. "A 19.8% efficiency honeycomb multicrystalline silicon solar cell with . . . ," IEEE Transactions on Electron Devices, vol. 46, No. 10, pp. 1978-1983 (1999).

Kayes, B. M., et al., "Comparison of the device physics principles of planar and radial p-n junction nanorod . . . " J. Appl. Physics, vol. 97, pp. 114302 (2005).

Hu, L.,, et al., "Analysis of Optical Absorption in Silicon Nanorwire Arrays for Photovoltaic Applications," Nano Letters, vol. 7, No. 11, p. 3249 (2007).

Klipstein, P., "XBn barrier photodetector for high sensitivity and high operating temperature infrared . . . ," Proceedings of SPIE, vol. 6940, paper 69402U-1 (2008).

* cited by examiner

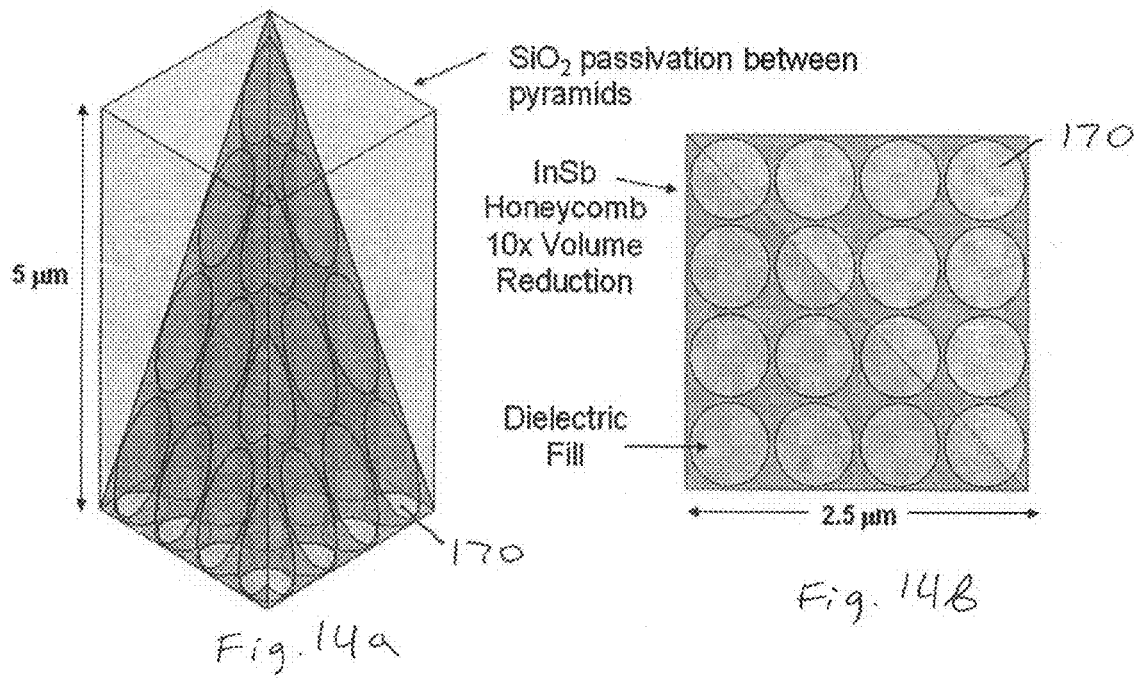
Fig. 14a
Fig. 14b
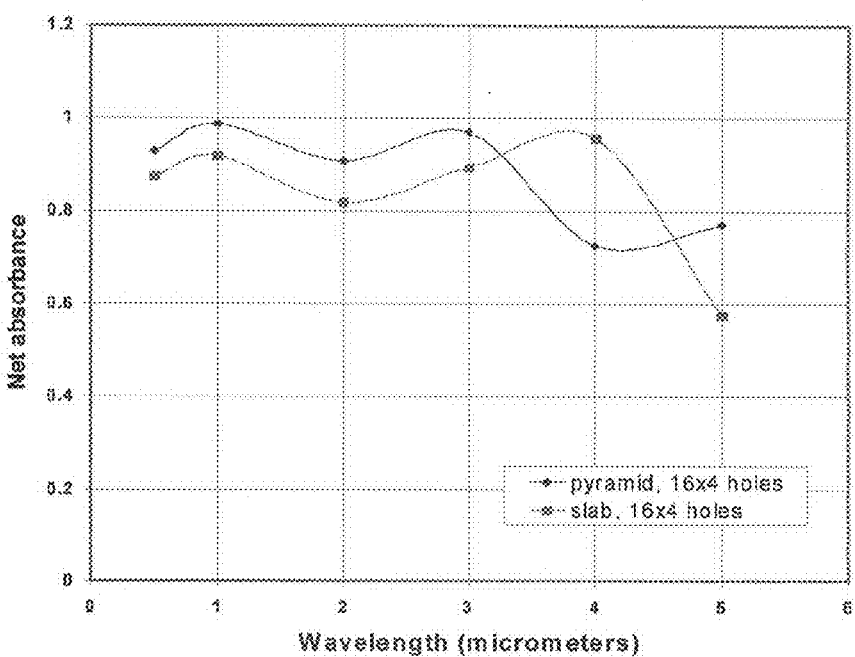
Fig. 15

HONEYCOMB INFRARED DETECTOR

This application is related to co-pending application U.S. application Ser. No. 12/544,218, filed on the same date as the present application, for "Wide Bandwidth Infrared Detector and Imager" by Daniel Yap, Rajesh D. Rajavel, Sarabjit Mehta and Joseph S. Colburn, the disclosure of which is incorporated herein by reference in its entirety. This application is also related to co-pending application U.S. application Ser. No. 12/544,221, filed on the same date as the present application, for "Reduced Volume Infrared Detector" by Daniel Yap, Rajesh D. Rajavel, Sarabjit Mehta and James H. Schaffner, the disclosure of which is incorporated herein by reference in its entirety.

FIELD

The present disclosure relates generally to photon detectors.

BACKGROUND AND PRIOR ART

According to prior art, optical quantum detectors (which absorb incident photons and generate electrical charge carriers) generally have highest sensitivity over a fairly small bandwidth, generally one octave or less. Contrary to the present disclosure, prior art detectors, used in optical imagers, generally make use of an optical anti-reflective coating to increase the amount of incident light that is coupled into their light-absorbing material.

Prior art infrared detectors are described in a Technical Information document (SD-12) by Hamamatsu Photonics K. K. Examples of prior photovoltaic and photoconducting detectors that have sensitivity in MWIR and/or LWIR wavelengths are described in an article by A. Rogalski (Journal of Applied Physics, vol. 93, no. 8, 15 Apr. 2003, pp. 4355-4391). In general, these detectors are formed as 2-dimensional arrays of detector pixels that are connected physically and electrically to a silicon read-out integrated circuit (ROIC). Photovoltaic detectors typically contain P-type semiconductor material, N-type semiconductor material and a PN junction. The incident light can be absorbed primarily in the P-type material, primarily in the N-type material or in substantially both P-type and N-type materials.

As depicted in FIGS. 1a-1d, prior infrared detectors 20, 22 and 24 often comprise a substrate 10 on which the array of detector pixels 12 is formed. The incident light 14 illuminates the substrate 10 and passes through the optically transparent substrate 10 to the detector pixels 12, as depicted in FIG. 1a. For these detectors, each detector pixel 12 may be connected to the ROIC 18 by means of a solder bump 16, depicted in FIG. 1b. With the detectors 20 and 22, the substrate 10 is generally not removed and individual pixels 12 are defined by etching mesa structures that include the PN junction of a detector pixel 12. For detector 24, illustrated in FIG. 1c, which comprise a thick film of the light-absorbing material 30, electrical vias 28 are etched through the absorbing film 30 and a PN junction 32 is formed around each of the vias 28. Metal 34 is then coated over the vias 28 and provide electrical connections between the PN junctions 32 and the ROIC 18. According to prior art, detectors 20, 22 and 24 can be coated with an anti-reflecting film to improve the capture of the light 14. The anti-reflecting film is normally composed of one or more quarter-wave thickness layers of material that have a value for its refractive index that is between the value of the refractive index of the incident medium (such as air) and the refractive index of the substrate 14.

According to prior art, the infrared detectors 20, 22 and 24 can achieve high external quantum efficiency only over a limited optical bandwidth because of their anti-reflective coatings. Because a quarter-wave thickness is achieved exactly for only one specific wavelength of the incident light, the anti-reflective coating is effective for only a small band of wavelengths (nominally less than an octave).

To achieve high internal quantum efficiency, the light-absorbing layer (or layers) of infrared detectors in the prior art must have a thickness that is sufficiently large to permit enough of the incident light, coupled in through its front surface, to be absorbed. In fact, the thickness of the absorber must be sufficient to absorb light at the longest wavelength of its desired band of operation. For high efficiency, that thickness is typically several times the value of the longest wavelength of the band, even when the detector has a metal reflector at its back side that enables the overall path-length of the light through the absorber to be doubled. Noisy "dark" current can be generated in the volume of the absorber because of thermal generation of electrical carriers. Thus, having a thick absorber means that the total volume of material contributing to the dark current is large, and the dark current is high. This degrades the detectivity of the detectors 20, 22 and 24. In contrast, a novel infrared detector (imager) presently disclosed, does not require an anti-reflecting film and it provides low reflection for incident light over a large bandwidth of multiple octaves with reduced dark current.

Like optical quantum detectors, solar cells have also been developed to absorb light, however at visible wavelengths. And, solar cells generally do not absorb light at MWIR wavelengths. Solar cells are generally made from material such as silicon. Although both solar cells and infrared imagers have been widely used commercial products for several decades, there does not appear to be any known attempts to combine the features of these two kinds of devices.

Surfaces with shallow pyramid-shaped features and the light trapping benefits of such surfaces are known from the field of solar cells. An article by M. A. Green, et al. ("Very High Efficiency Silicon Solar Cells—Science and Technology", IEEE Transactions on Electron Devices, vol. 46, no. 13, October 1999, pp. 1940-1947) describes solar cells that contain pyramid-shaped surfaces. The light trapping properties of pyramidally textured surfaces is described in an article by P. Campbell and M. A. Green (Journal of Applied Physics, vol. 62, no. 1, 1 Jul. 1987, pp. 243-249). Prior art solar cell 38, depicted in FIG. 2, has pyramids 40 with height that are small compared to the overall thickness of the light-absorbing material 42. This is because for solar cells, the dark current noise is not a problem of concern. In contrast, in the infrared imager presently disclosed, the height of the pyramid is large compared to the overall thickness of the light absorbing material, with that pyramid height being about one half of the overall thickness of the light absorbing material.

Another prior art solar cell 44, depicted in FIG. 3, has pyramids 46 whose height is large compared to the overall thickness of the light absorbing material 48. This solar cell is described in an article by R. Brendel, et al. ("Ultrathin crystalline silicon solar cells on glass substrates," Applied Physics Letters, vol. 70, no. 3, 20 Jan. 1997, pp. 390-392). In the solar cell 44, the PN junctions 50 are located near the sloped faces or sidewalls at the backside of the device. In contrast, for some embodiments of the present invention, the PN junctions may be located near the tips of the pyramid structures at the backside of the device. This allows the infrared imager presently disclosed to achieve reduced area of the junction depletion regions, thereby reducing the dark current from those depletion regions.

Another prior art solar cell with back-side electrical contacts whose PN junction area is small is described in an article by R. M. Swanson, et al. ("Point-contact silicon solar cells," IEEE Transactions on Electron Devices, vol. ED-31, no. 5, May 1984, pp. 661-664). Solar cells having localized PN junctions at their back side as wells as pyramid-shaped texturing of their front side are depicted in FIG. 4 and are described in an article by R. A. Sinton, et al. (27.5 percent silicon concentrator solar cells," IEEE Electron Device Letters, vol. EDL-7 no. 10, October 1986, pp. 567-569). Diffusion of the doped regions to create such PN junctions involves subjecting the material to fairly high temperatures, generally >400 degrees-C., and is not compatible with the processes involved in fabricating devices that have thin light absorbing material.

As depicted in FIG. 6, detectors, such as those in focal-plane array (FPA) imagers, have absorber regions that comprise a thick planar film that is solid (or continuous). It is described in more detail in an article by H. Yuan et al. ("FPA development: from InGaAs, InSb to HgCdTe", Proceedings of SPIE Vol. 6940, paper 69403C, 2008). According to Yuan, each detector pixel is electrically connected, separately, to the read-out integrated circuit (ROIC) 56 by means of a solder bump 58. The array of detectors 64 also makes a common electrical connection to the ROIC 56 because they share a contiguous absorber layer 60 composed of n-HgCdTe material. The mesas that define the individual pixels of the detector array 64 are etched through the p+ layer 62 and only partly into the n-HgCdTe layer 60. The detector array 64 has volume of absorber material that contributes to the thermally generated (diffusion) dark current as defined by the thickness of that n-HgCdTe absorber layer 60 times the total area of the detector array 64. In this example, a way to reduce the diffusion-current component of the dark current would be to reduce the thickness of the absorber layer 60. However, such a reduction in layer thickness would also reduce the amount of incident light 66 that is absorbed, thereby reducing the quantum efficiency of the detectors.

A known method for reducing the volume of the absorber is shown in FIG. 7. This method involves placing the detector at the back end of an optical concentrator 70 such as a Winston cone. This method is more fully described in an article by T. Ashley, et al. ("Epitaxial InSb for elevated temperature operation of large IR focal plane arrays," Proceedings of SPIE Vol. 5074 (2003), pp. 95-102). An array of such concentrators and detectors would have cones that abut each other at their entrances but those detectors would be physically isolated from each other. Thus, each detector would need to have both of its electrical connections (its P-connection and its N-connection) made to the detector itself. As a consequence, the ROIC would need to provide two electrical connections to each pixel rather than one electrical connection to each pixel, with the other electrical connection being a "common" connection.

According to FIG. 8, a prior-art solar cell 72 has a surface texture with a honeycomb 74 pattern. The solar cell 72 is described in more detail in an article by Zhao, et al. ("A 19.8% efficiency honeycomb multicrystalline silicon solar cell with improved light trapping," IEEE Transactions on Electron Devices, vol. 46, no. 10, October 1999, pp. 1978-1983). The honeycomb 74 textured surface improves the trapping of the incident light so that the light can be absorbed by the solar cell 72 rather than being reflected away. The honeycombs 74 are a surface texture with a pitch or spacing of 14 µm and a thickness of less than 1 µm. The thickness of the absorber in the solar cell 72 is >200 µm. Thus, the volume represented by the honeycomb is a small fraction of the total volume of the light absorber. There is a need for a detector structure that has reduced volume of absorber material. There also is a need for a reduced-volume detector structure that provides low-resistance lateral flow of the photogenerated carriers, so that those carriers can be collected through the extractor regions or at the ohmic common contacts.

An article by Tokranova et al. (Proceedings of SPIE, Vol. 5723, pp. 183-189 (2005)) describes a solar cell comprising a film of porous silicon in which the 16 pores are filled with an organic material. The sunlight is absorbed primarily by the organic material, which in this case is copper phthalocyanine (CuPC), since the absorption efficiency of the porous silicon is poor. Absorption of the light in the CuPC results in generation of electrical charge carrying holes and electrons. The sides of the pores provide a large-area interface between the p-type CuPC and the n-type silicon material that serves to separate the photo-generated holes, which are transported in the porous silicon material, from the photo-generated electrons, which are transported in the CuPC. These prior art devices, however, would not be suitable for use as a low-noise detector. These devices have very large PN junction area and thus the relative contribution of the dark current due to generation in the junction depletion regions is very high. In contrast, the presently disclosed detectors have much smaller PN junction area that can benefit from the reduction of the absorber volume.

A novel infrared detector (imager) with low reflection for incident light over a large bandwidth of multiple octaves and with reduced dark current and reduced volume of absorber material is presently disclosed.

BRIEF DESCRIPTION OF THE FIGURES

FIG. 13b depicts a bottom view of a detector array shown in FIG. 13a.
FIGS. 14a-14b depict basic unit-cell used for HFSS simulations of detector array according to the present disclosure.
FIG. 15 depicts comparison of simulated absorbance for slab honeycomb absorber and pyramidal honeycomb.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

The present disclosure relates to photon detectors that may be used in a focal-plane-array optical imagers. The constraints for photon detectors are quite different from the constraints associated with most solar cells described above. The photon detector performance is given in terms of its signal to noise ratio. Although the detected signal is to be maximized, the noise (from thermal generation of electrical carriers rather than from carrier generation accompanying photon absorption) must be kept low. In contrast, a solar cell is concerned with carrier generation but not with noise. Furthermore, the photon detector usually has an absorber material with a direct energy-band gap. Thus, the absorption efficiency is high. Usually the thickness of the absorber is no more than 2 times the longest wavelength of the light to be absorbed, especially when there is a back-side reflector for two-pass absorption. In contrast, most solar cells have an absorber material such as silicon with poor absorption efficiency. Thus, the thickness of a solar cell typically is many times larger (e.g., 10× to 50×) than the wavelength of the light to be absorbed.

The novel infrared detector (imager) presently disclosed contains novel quantum detectors having very broad bandwidth, for example, such as having sensitive detection ranging from visible to midwave infrared (MWIR) wavelengths (e.g., 0.4-5.0 μm). The imager may contain an array of multiple detectors, arranged as a collection of pixels, that are electrically coupled to a read-out integrated circuit. Also, the pixel array may lie on a focal plane of imaging optical elements, such as lenses.

Figure 1:
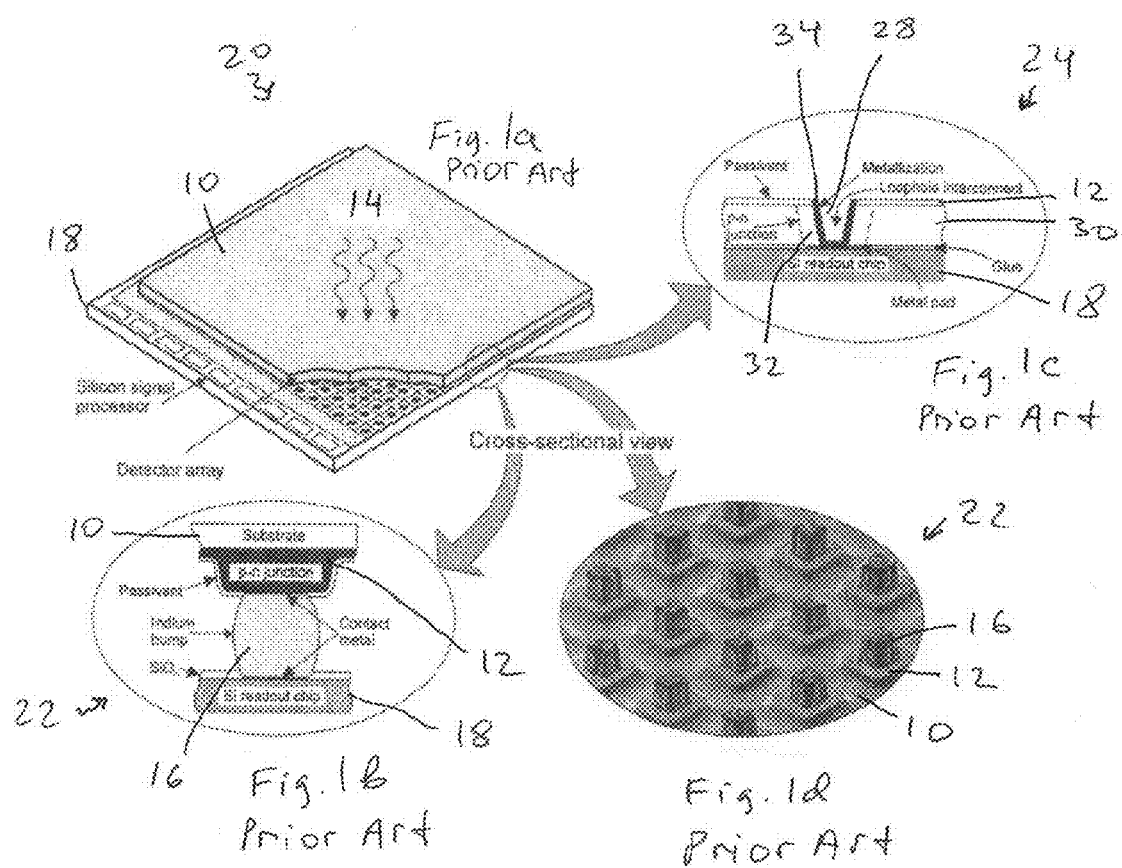
FIGS. 1a-1d depict Prior-Art optical imagers.
Figure 2:
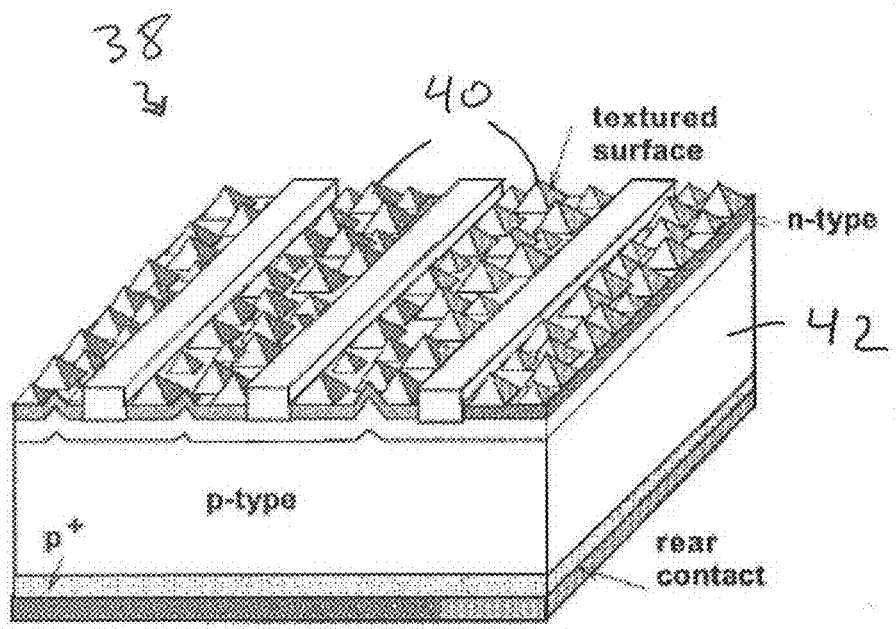
FIG. 2 depicts Prior-Art solar cell with pyramidally textured surface.
Figure 3:
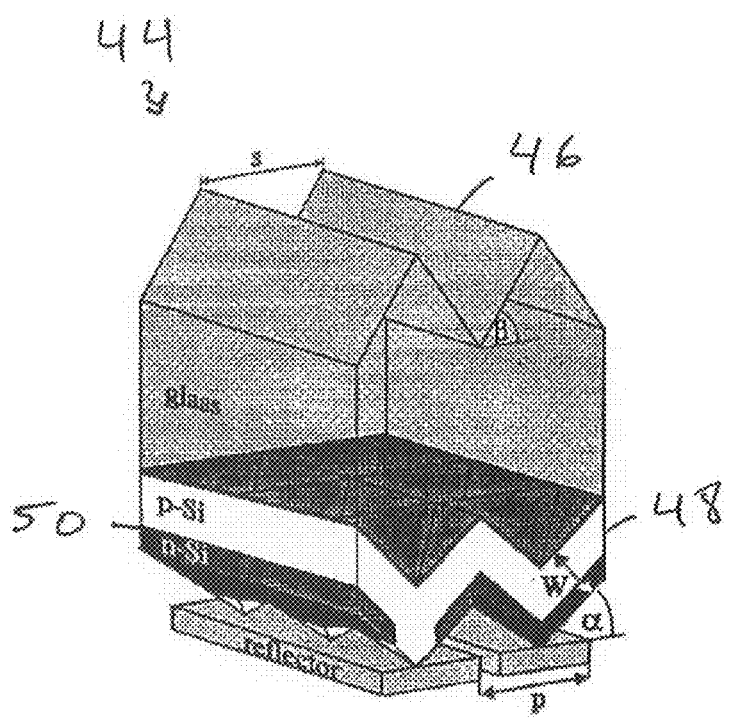
FIG. 3 depicts Prior-Art solar cell with sloped sidewalls.
Figure 4:
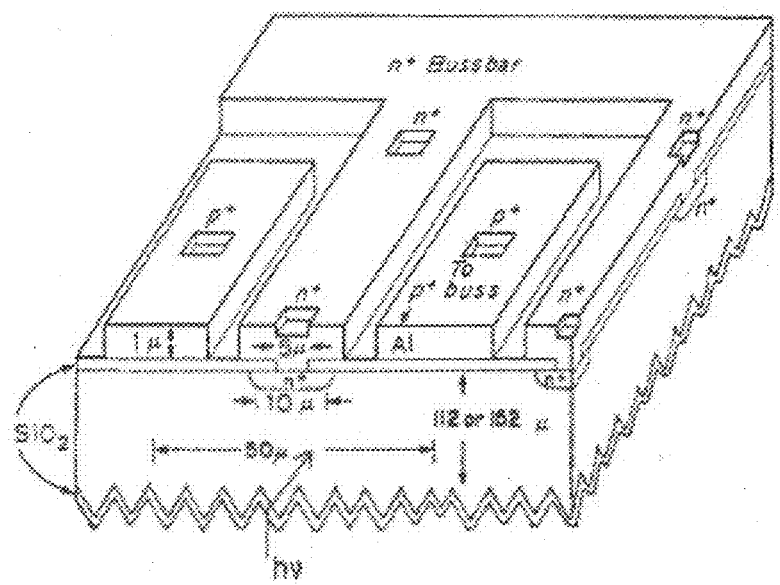
FIG. 4 depicts Prior-Art solar cell with back side contacts.
Figure 5:
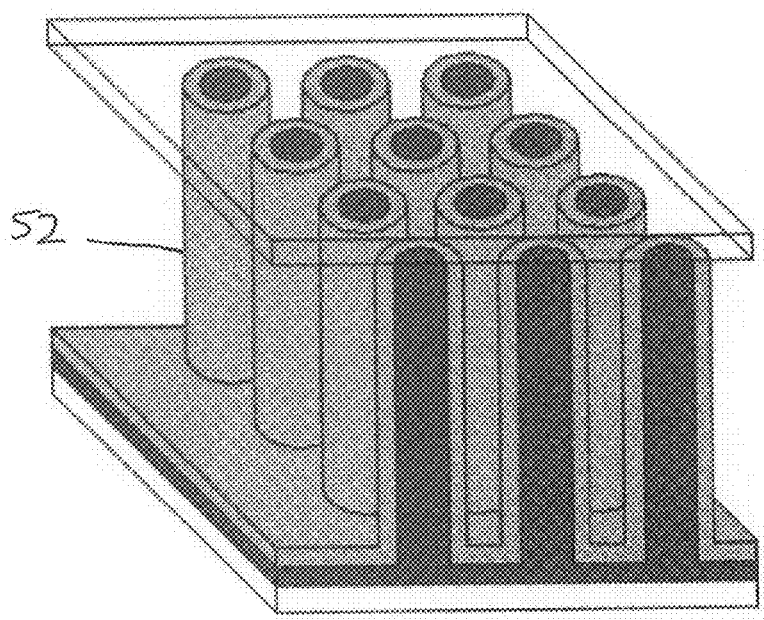
FIG. 5 depicts Prior-Art solar cell with nanorods with PN junction.
Figure 6:
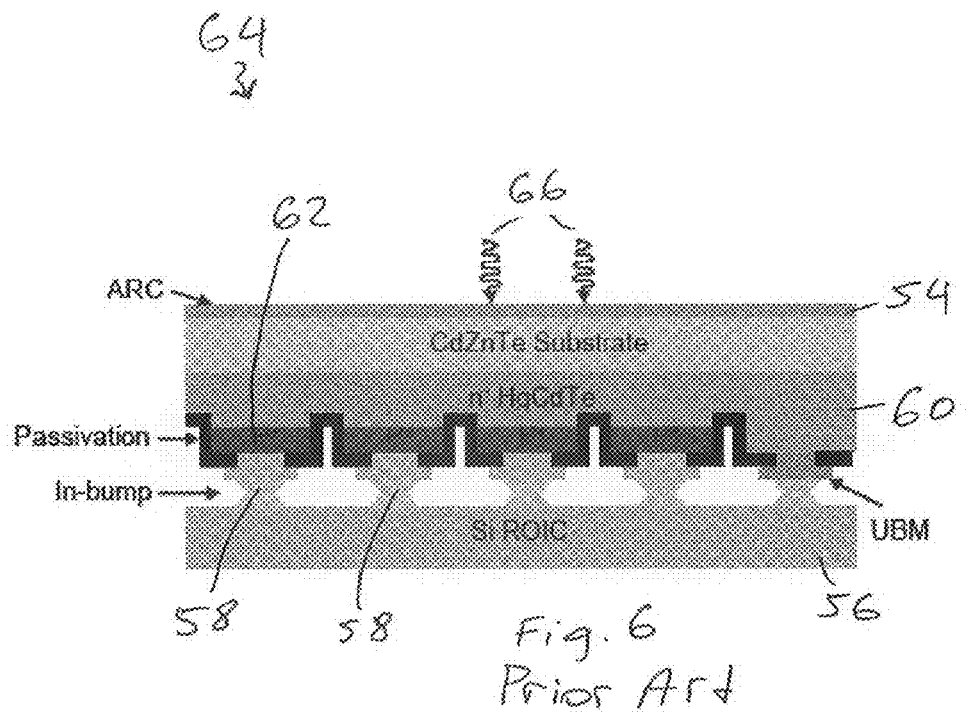
FIG. 6 depicts an array of Prior-Art detectors in a focal-plane-array imager.
Figure 7:
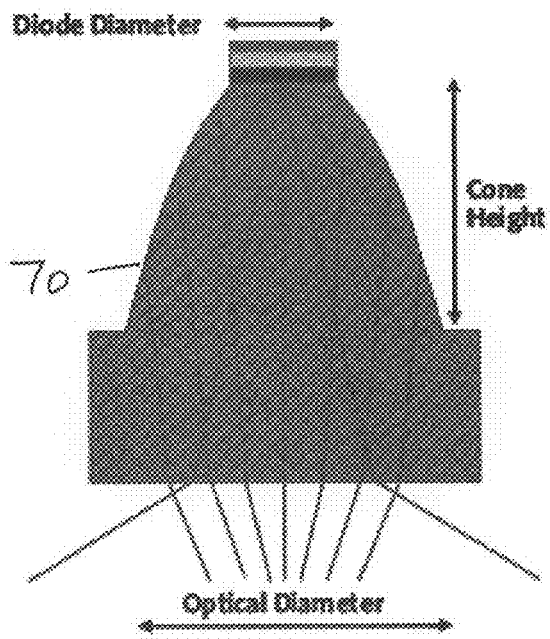
FIG. 7 depicts a reduced diameter photodetector combined with Winston cone optical concentrator according to Prior-Art.
Figure 8:
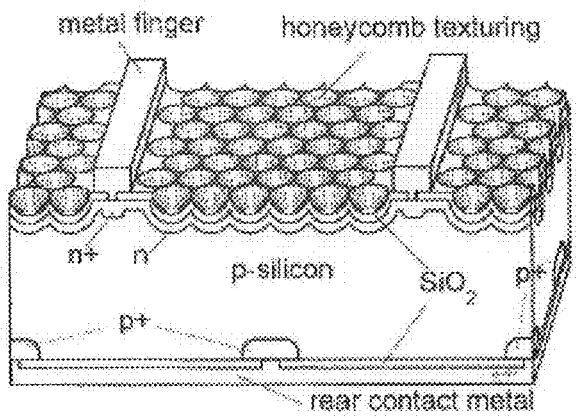
FIG. 8 depicts Prior-Art solar cell with honeycomb surface texture.
Figure 9:
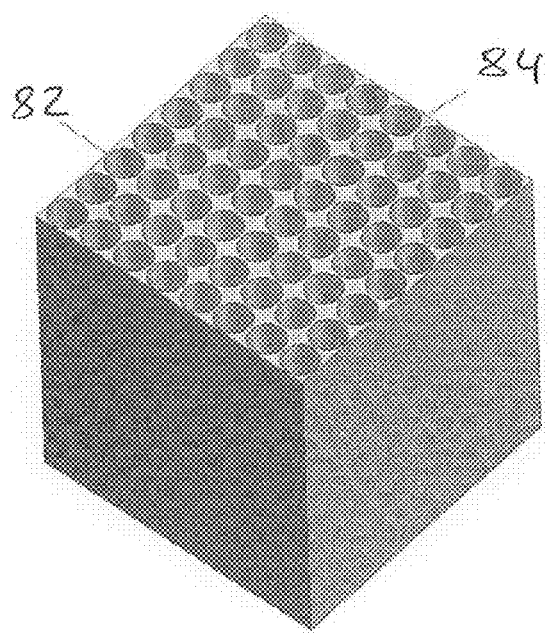
FIG. 9 depicts a honeycomb absorber structure.

FIG. 9 depicts a perspective view of an exemplary honeycomb absorber 80 of an infrared detector array. The honeycomb absorber 80 may be a slab of absorber material with holes 82 in it. The remaining absorber material forms a honeycomb-like frame 84. The honeycomb absorber 80 may absorb the incident light at least as efficiently as a planar, solid absorber. However, the honeycomb absorber 80 accomplishes this efficient absorption with a much smaller volume of absorber material. For temperatures of 200K and higher, the dominant contribution to the dark current noise is thermal generation in the narrow-bandgap absorber material (assuming that the absorber material has sufficiently good quality and is sufficiently free of defects). Thus, the dark current can be reduced and the detectivity of the infrared detector improved by reducing the volume of the absorber material. Also, the honeycomb absorber 80 presents a much lower effective optical refractive index to the incident light. Thus, there is much less reflection of that light from the front surface of the honeycomb absorber. As a result, more of the incident light is coupled into the honeycomb absorber 80 to be absorbed. This low reflectance is achieved over a large range of incident wavelengths.

Figure 10:
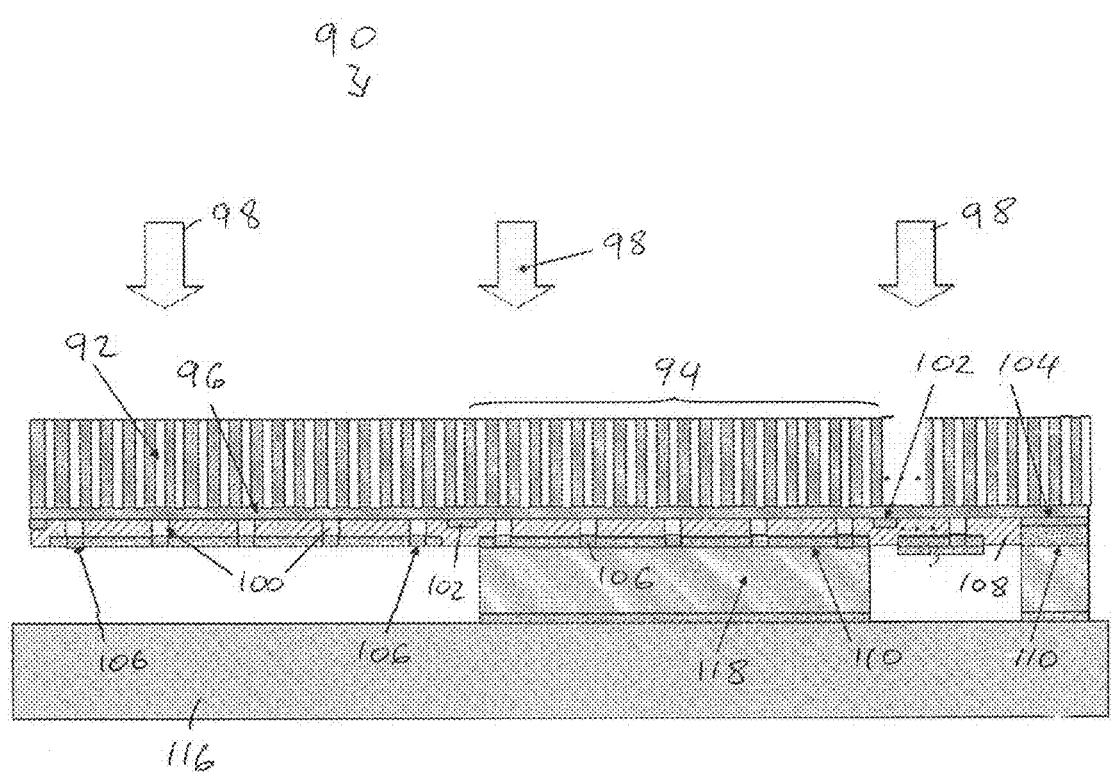
FIG. 10 depicts a detector array with a honeycomb absorber.

FIG. 10 depicts a detector array 90 with a honeycomb absorber 92. The honeycomb absorber 92 may extend over multiple detector pixels 94 of the detector array 90. In one exemplary embodiment, the honeycomb absorber 92 is disposed above a base layer 96. The base layer 96 may be made of material that absorbs the same incident light 98 as the honeycomb absorber 92. In another exemplary embodiment, the base layer 96 may be transparent to the incident light 98. In another exemplary embodiment, the detector array 90 may not contain a base layer. Referring to FIG. 10, the detector array 90 also includes extractors 100 disposed on the bottom side of the base layer 96, if present, or on the bottom side of the honeycomb absorber 92 if there is no base layer. The extractors 100 serve to extract or collect the photo-generated minority carriers from the honeycomb absorber 92 and base layer 96. The detector array 90 may also include semiconductor/metal contacts 102, 104 and 106. The semiconductor/metal contacts 102, 104 and 106 may be Ohmic contacts. The contacts 106 are electrically connected with extractors 100. The contacts 102 and 104 are electrically connected to the back side of the base layer 96, when the base layer 96 is present, or to the back side of the honeycomb absorber 92 if the base layer is not present. The base layer 96 provides an alternate path for lateral conduction of the electrical carriers from the honeycomb absorber 92 to the extractors 100. For a honeycomb absorber 80 depicted in FIG. 9, the base layer may be optional as the honeycomb absorber 80 may provide sufficient lateral conduction of the photo-generated electrical carriers.

The back side of the honeycomb absorber 92 or base layer 96 may further be covered with a dielectric layer 108 that also serves to passive the bottom surface of the semiconductor base layer 96 or the honeycomb absorber 92. Furthermore, additional surface-passivating films (not shown) may cover the sidewalls of the honeycomb holes as well as the top side of the honeycomb absorber 92. Metal bond pads 110, which also serve as reflective mirrors for the incident light 98, may cover the back side of the detector pixels 94. These metal bond pads 110 provide a means to couple the photo-generated current from a detector pixel 94 out to the read-out integrated circuit 116 of an optical imager (not shown), of which the detector array 90 may be part of. The detector array 90 may be bonded to the read-out integrated circuit 116 through solder bumps 118. Some metal bond pads 110 are in electrical contact with the contacts 106 and provide a low resistance interconnection between the contacts 106 associated with a given detector pixel 94. Some metal bond pads 110 are in electrical contact with the contact 104 and provide a means to connect to the common electrical contact of the detector array 90. There is no need for the detector array 90 to have an anti-reflecting film deposited on its top side since the honeycomb absorber 92 achieves anti-reflection performance over a large range of wavelengths for the incident light 98.

The detector array 90 has ohmic contacts 102 formed near each detector pixel 94. By forming the ohmic contacts 102 at the periphery of each detector pixel 94, the thickness of the base layer 96 may be reduced or the base layer 96 may not be even used, thereby further reducing the total volume of absorber material. The pattern of ohmic contact metal 102, and the optional metal interconnect lines (not shown) that contact to and interconnect the ohmic contacts 102, form a low-resistance path for the photo-generated electrical current to flow from each pixel 94 to the "common" bond pads 104 that are located at the periphery of the detector array 90. By using the low-resistance metal paths to carry the current instead of requiring the photo-generated majority carriers to flow through the absorber 92, the thickness of absorber material can also be reduced to further reduce the dark-current generation volume of the detector array, thereby improving its detectivity.

Figure 11:
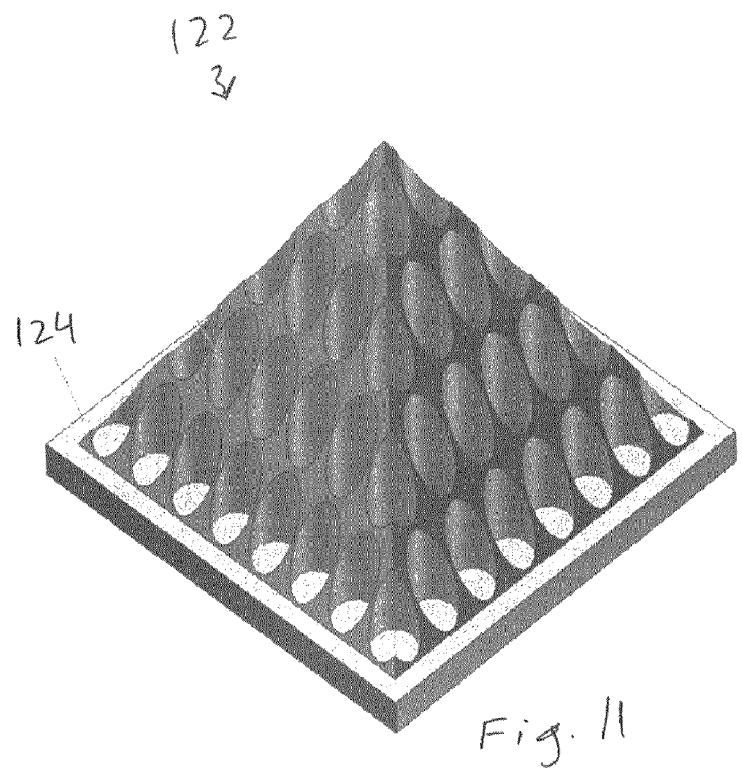
FIG. 11 depicts a pyramid-shaped honeycomb absorber structure according to the present disclosure.
Figure 12:
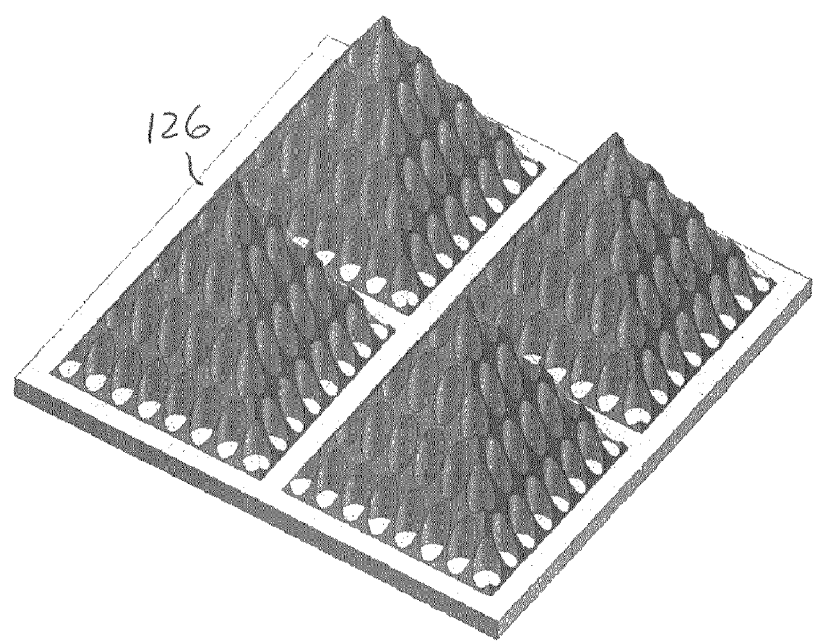
FIG. 12 depicts a detector pixel with multiple honeycomb pyramids according to the present disclosure.

FIG. 11 depicts an exemplary embodiment of honeycomb absorber 122 with a pyramidal outline according to the present disclosure. The apex of the pyramid may be pointed toward the incident light. In this exemplary embodiment, the base layer 124 may be disposed on the back side of the honeycomb pyramid 122. In one exemplary embodiment, a detector pixel may include multiple honeycomb pyramids as shown in FIG. 12. The bases of those pyramids in FIG. 12 may abut each other or they be separated by small gaps. The base layer 126 may provide the necessary lateral conduction for electrical carriers between adjacent pyramids.

For a large range of wavelengths of the incident light, the pyramidal honeycomb may provide comparable absorption of that incident light as the bulk honeycomb absorber, even through the volume of the absorber material in the pyramidal honeycomb is $\frac{1}{3}^{rd}$ as great. Also, for a large range of wavelengths of the incident light, the pyramidal honeycomb may provide absorption comparable to that obtained with a solid pyramidal absorber, although the volume of the absorber material again is reduced by at least 2-3×. Thus, the pyramidal honeycomb may have greater detectivity, D*, since its dark current is lower even though its quantum efficiency is comparable.

Figure 13A:
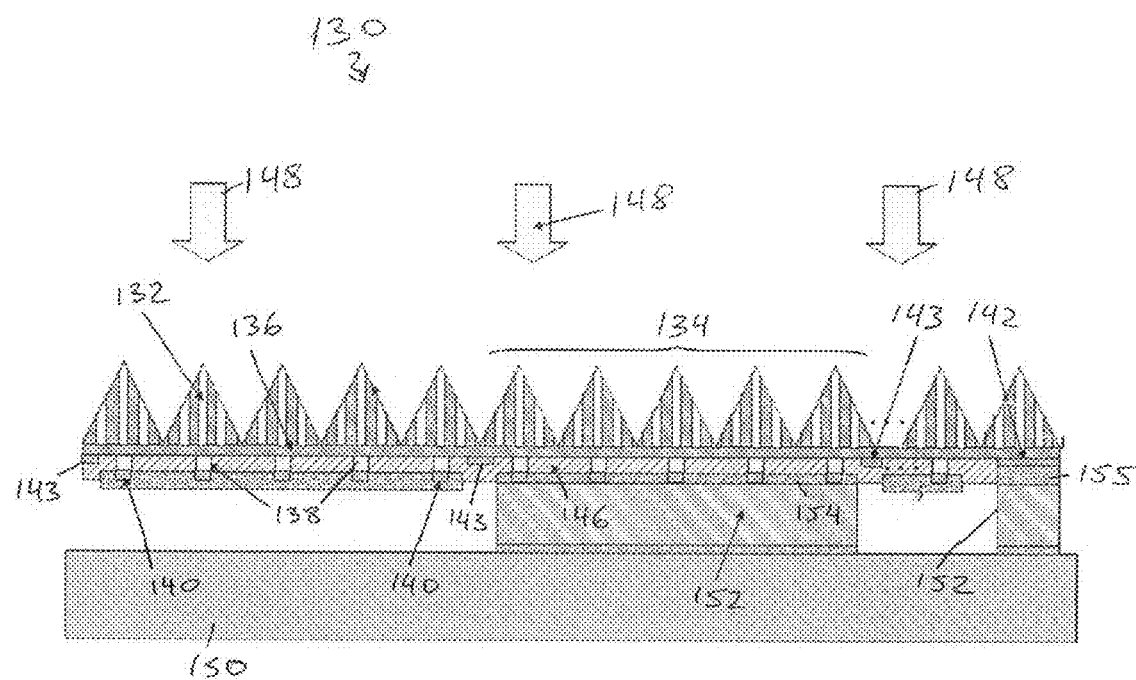
FIG. 13a depicts a detector array with pyramid-shaped honeycomb absorber according to the present disclosure.

FIG. 13a depicts another exemplary embodiment of a detector array 130 according to the present disclosure. The detector array 130 may contain honeycomb pyramidal absorbers 132. There may be multiple pyramidal absorbers 132 in each of the detector pixel 134. The pyramidal absorbers 132 may be disposed above a base layer 136. The base layer 136 may be composed of the same material as the honeycomb pyramidal absorbers 132. The honeycomb pyramidal absorbers 132 provide lateral conduction for the carriers within a pyramid and the base layer 136 provides lateral conduction between the pyramids of a detector array 130. The detector array 130 also contains extractor regions 138 disposed on the back side of the base layer 136. In one exemplary embodiment, if the base layer 136 and honeycomb pyramidal absorbers 132 are composed of n-type semiconductor material (such as, for example, InAlSb material or InAsSb material), the extractor 138 may be composed of p-type semiconductor material (such as, for example, InAlSb material or GaSb material). The extractor regions 138 may be coupled to metal-semiconductor contacts 140. The metal-semiconductor contacts 140 may be Ohmic contacts and may be disposed on the back side of the extractors 138. Additional contacts 142 and 143 may be coupled to portions of the base layer 136. The contacts 142 and 143 may be Ohmic contacts. The contacts 143 may be disposed beneath the valley between two adjacent pyramids. The contacts 142 and 143 may have fairly small area. In one exemplary embodiment, the contacts 142 and 143 may have a width of 1 micrometers and a length of 4 micrometers. The contacts 142 and 143 may be formed near the periphery of the detector pixel 134. The extractor regions 138 and the contacts 140 may also have small area. In one exemplary embodiment the extractor 138 and the contacts 140 may have an area of 0.5×0.5 micrometers. In another exemplary embodiment, the extractors 138 are located directly below the apex of the honeycomb pyramidal absorbers 132.

Figure 13B:
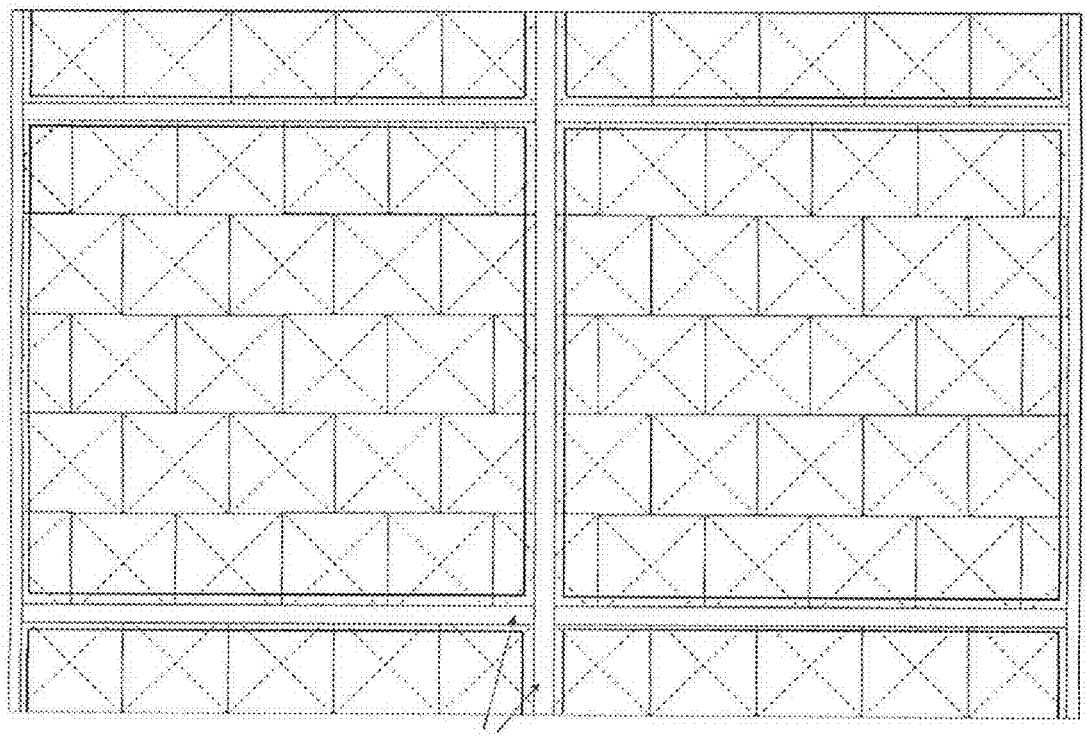

The backside of the base layer 136 may also be covered with a dielectric layer 146 that may serve as a surface-passivation film for the absorber material of the base layer 136. The contacts 140 of a given detector may be interconnected by means of a metal bond pad 154. This bond pad may also provide an electrical output for the photo-generated current from the detector pixel 134. The contacts 142 and 143 may be interconnected by means of metal lines or strips 157 formed on the backside of the base layer 136, as shown in FIG. 13b. The dielectric layer 146 serves to electrically isolate the bond pads (connecting to the contacts 140) from the contacts 142 and 143 and their interconnecting metal lines (not shown). In one exemplary embodiment, the metal bond pads (connecting to the contacts 140) may substantially cover the back side of a detector pixel 134. The metal bond pads (connecting to the contacts 140) may also serve as reflectors for the incident light 148. In another exemplary embodiment, additional metal bond pads 155 may be located near the periphery of the detector array 130 and are connected to the contacts 142 to provide electrical common connection to the detector array 130.

In one exemplary embodiment, the sidewalls of the holes in the honeycomb pyramidal absorbers 132 as well as the sloped top-side surfaces of the honeycomb pyramidal absorbers 132 may be covered with a surface-passivating film (not shown). Since the honeycomb pyramidal absorbers 132 have very large surface area compared to its volume, the surface passivation film (not shown) may be used to control the dark current associated with surface states and also to control the surface recombination that would otherwise remove the photo-generated carriers and prevent them from being collected at the contacts 140, 142 and 143. The surface-passivating film may be composed of evaporated silicon dioxide, spin-on polymers (such as, for example, benzo-cyclo-butene or polyimide) or wide-bandgap semiconductor material such as GaAlAsSb. The detector array 130 may be bonded to the read-out integrated circuit 150 through solder bumps 152. Some metal bond pads 154 are in electrical contact with the contacts 140 and provide a low resistance interconnection between the contacts 140 associated with a given detector pixel 134. Some metal bond pads 155 are in electrical contact with the contact 142 and provide a means to connect to the common electrical contact of the detector array 130. There is no need for the detector array 130 to have an anti-reflecting film deposited on its top side since the honeycomb pyramidal absorbers 132 achieves anti-reflection performance over a large range of wavelengths for the incident light 148.

In one exemplary embodiment, HFSS, a 3D electromagnetic field simulation and analysis tool (based on the finite element method) from Ansoft Corporation, was used to determine the absorption efficiency of the honeycomb absorber and of the pyramidal honeycomb. FIGS. 14a-14b depict an exemplary unit cell that was used for an HFSS calculation. FIG. 14a depicts a side perspective view of the exemplary one-quarter unit cell that was used for one the HFSS calculations. FIG. 14b depicts a top view of the exemplary one-quarter unit cell that was used for one the HFSS calculations. The honeycomb pyramid may be manufactured to be symmetric about its apex so that only one-fourth of a pyramid needs to be defined for the simulation. In this exemplary embodiment, simulations were preformed under assumption that the collection of pyramids form a periodic array. The FIGS. 14a-14b depicts a structure with 16 holes 170 in each quadrant of a pyramid. The holes have a diameter of 0.6 micrometers and the pyramid has a height of 5 micrometers and a base length of 5 micrometers. In this exemplary embodiment, HFSS simulation was performed without a base layer and with a metal reflector located at the base of the pyramids. The model structure shown in FIGS. 14a-14b has $\frac{1}{10}^{th}$ the volume of an absorber of comparable 5 micrometer height or thickness. Although a model with 16 holes per quadrant is shown as an example, the same $\frac{1}{10}^{th}$ (or 0.1) volume fill ratio can be achieved with other arrangements of the holes and also with other numbers and sizes of holes. The holes shown in FIGS. 14a-14b are placed on a rectangular grid.

FIG. 15 depicts the results of the HFSS simulations for a pyramidal honeycomb with 0.1 volume fill ratio and 16 holes in a quadrant as shown in FIGS. 14a-14b. The absorbance of a pyramidal honeycomb is greater than 70% for incident light with wavelengths between 0.5 and 5 micrometers. In comparison, the absorbance of a honeycomb slab with the same hole-size and pattern also is greater than 70% for wavelengths of 4 micrometers and shorter. However, the pyramidal honeycomb has ⅓ the volume of the honeycomb slab. Thus, the pyramidal honeycomb should have 3× higher detectivity, assuming the dark current can be attributed solely to "diffusion" current from the absorber material.

Figure 16:
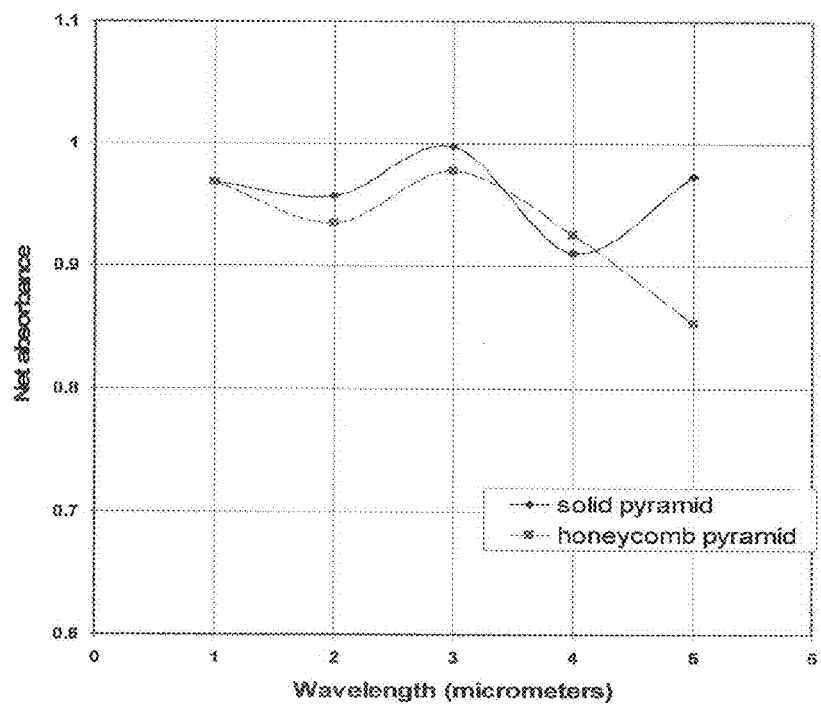
FIG. 16 depicts comparison of simulated absorbance for pyramidal honeycomb absorber and for solid pyramid absorber.

FIG. 16 compares the simulated absorbance of a honeycomb pyramid with a solid pyramid of the same height and base length based on HFSS simulations. The honeycomb pyramid has a volume fill ratio of 0.1 whereas the solid pyramid has a volume fill ratio of 0.33. Note that the honeycomb pyramid has comparable absorbance to that of the solid pyramid for wavelengths of the incident light of 4 micrometers and shorter. This comparable absorbance is obtained even though the volume of absorber material in the honeycomb pyramid is $\frac{1}{3}^{rd}$ as great. Thus, the honeycomb pyramid provides a way to improve the detectivity of the detector array, by reducing the volume of the dark-current producing absorber material, while still achieving high absorption efficiency and high quantum efficiency.

Although the results presented in FIG. 15 are for honeycomb structures in which the holes are placed on a square grid, other patterns could be used for the holes. In one exemplary embodiment, the holes may be placed on a hexagonal pattern, such as a hexagonal close packed arrangement.

Figure 17A:
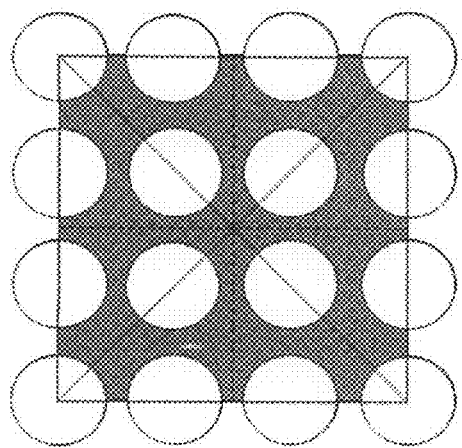
FIGS. 17a-17b depict exemplary hole patterns for honeycomb absorbers.
Figure 17B:
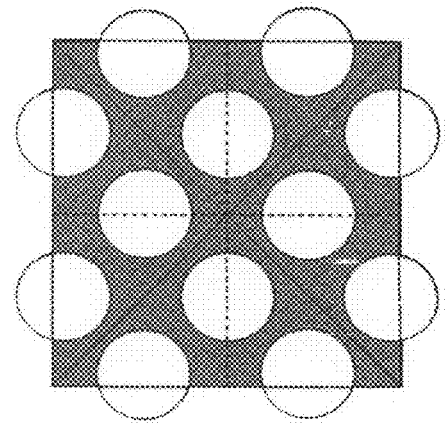

The simulation results shown in FIG. 16 were for a honeycomb pyramid having the hole-pattern depicted in FIG. 17a. Approximately similar absorbance results (not shown) were obtained for the hole-pattern shown in FIG. 17b. FIGS. 17a-17b depict two configurations that have the same number of holes and the same hole-diameter. The diameter of the holes in FIGS. 17a-17b is 1.68 micrometers. Holes in FIGS. 17a-17b may be formed by methods such as reactive ion etching.

Figure 18:
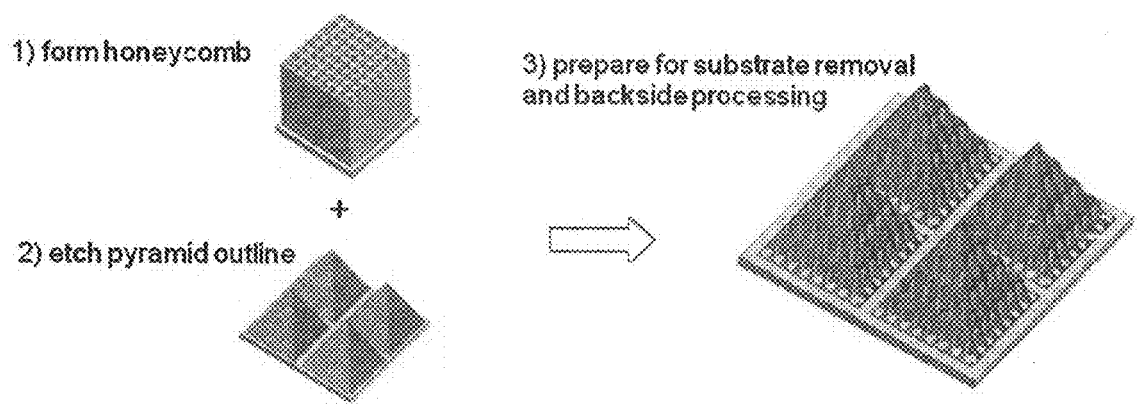
FIG. 18 depicts fabrication approach for pyramidal honeycomb.

FIG. 18 depicts the basic process of fabricating a detector array with honeycomb pyramidal absorbers. In one exemplary embodiment, the honeycomb absorbers may be formed by etching into the epitaxially grown absorber material. In another exemplary embodiment, the honeycomb absorbers may be formed by selective-area metal-organic chemical vapor deposition onto a substrate that has that honeycomb pattern etched into a growth-mask such as silicon dioxide. After the honeycomb absorbers are formed, a pyramidal outline can be formed by, for example, patterning a suitable mask material with a pyramidal shape and then transferring the pyramidal shape of the mask into the honeycomb structure. It may be desirable to temporarily fill the holes of the honeycomb absorbers with a removable material that has approximately the same etching properties as the absorber material of the honeycomb frame. Then, after the pyramids are formed, the substrate wafer with the pyramids can be attached to a handle wafer. This enables the substrate to be removed and thus expose the backside of the honeycomb structure for further processing.

FIGS. 19a-19l depict an exemplary fabrication process for fabricating the detector array and attaching that detector array to the read-out integrated circuit as described above. The following fabrication process is suitable for all of the embodiments disclosed herein of the detector array.

Figure 19A:
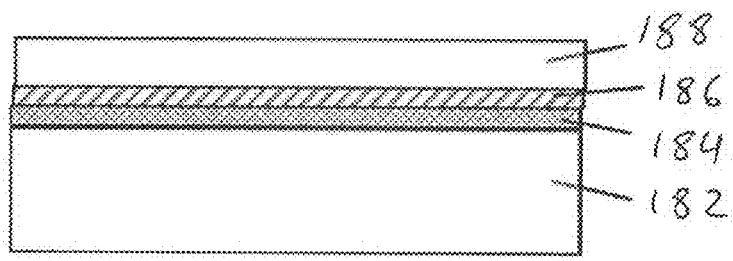
FIGS. 19a-19l depict a fabrication process for manufacturing detector array shown in FIG. 13.

Referring to FIG. 19a, using epitaxial growth technique such as molecular beam epitaxy or metal-organic chemical vapor deposition, an optional stop etch layer 184, an extractor layer 186 and then the absorber layer 188 are formed on a substrate wafer 182. In one exemplary embodiment, for detection of optical wavelengths of 4-5 µm and shorter, the substrate wafer 182 may be composed of GaSb material, the optional stop etch layer 184 may be composed of AlGaSb material, the p-doped extractor layer 186 may be composed of InAsSb material, and an n-doped absorber layer 188 may be composed of InAsSb material. In another exemplary embodiment, the substrate wafer 182 may be composed of GaSb material, the optional stop etch layer 184 may be composed of AlGaSb material, the n-doped extractor layer 186 may be composed of InAsSb material, and the p-doped absorber layer 188 may be composed of InAsSb material. Lattice matched $InAs_{0.9}Sb_{0.1}$, for example, provides absorption of wavelengths of 4.7 µm and shorter when operated at 300K temperature and absorption of wavelengths of 4.3 µm and shorter when operated at 200K temperature.

For detection of wavelengths as long as 5.0 µm at 200K temperature, material such as $InAs_{0.8}Sb_{0.2}$, having substantial lattice mismatch (approximately +0.7%), could be used. Another alternative to InAsSb is to use a Type II superlattice consisting of InAs/GaSb material for the absorber 188. Another example of a suitable substrate 182, for detection of >5.0 µm wavelength light, is InSb material. The optional stop etch layer 184 could be a thin layer of InAlSb material. The extractor 186 and absorber 188 could be composed of doped InSb or InAlSb material.

Other examples of extractor 186 materials include extractors 186 composed of multiple layers of semiconductor material. In one exemplary embodiment, the extractor 86 for an n-type InAsSb absorber 188 could be composed of layers of n-type GaAlAsSb and p-type GaSb materials. Such a structure facilitates the flow of the photo-generated electrons away from the extractors 186 and to the ohmic contact of the absorber 188. Such a structure also is effective in reducing the dark current that arises from the depletion layer between the absorber 188 and extractor 186, as discussed in an article by P. Klipstein ("XBn barrier photodetector for high sensitivity and high operating temperature infrared sensors," Proceedings of SPIE, vol. 6940, paper 69402U-1), which is incorporated herein by reference. In another exemplary embodiment, the extractor 186 for n-type InAsSb absorber 188 could be composed of layers of n-type GaAlAsSb, p-type GaSb and then n-type InAs materials. The use of the additional n-type InAs layer, which forms a Type II energy-gap alignment with the GaSb, permits the ohmic contact for both the extractor 186 and the absorber 188 to be made to n-type, narrow bandgap materials.

Figure 19B:
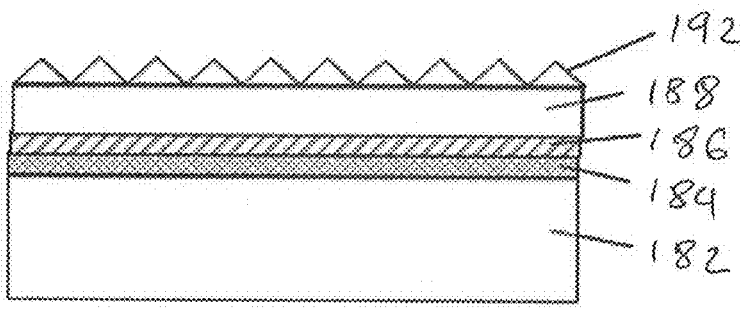
Figure 19C:
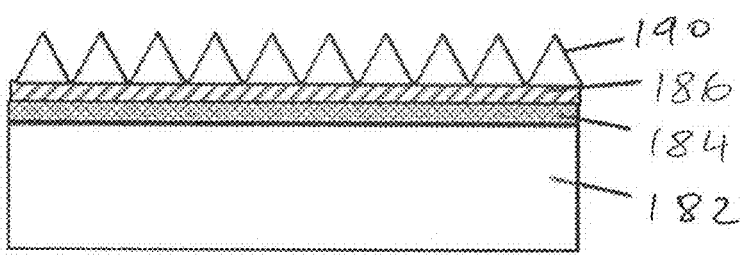

Referring to FIGS. 19b and 19c, pyramidal shapes 190 are formed in the absorber layer 88. The pyramidal shapes 190 may be formed after the holes for the honeycomb have been formed by etching or by selective area growth as described above. An etching process may be used to form pyramidal shapes 190. In one exemplary embodiment, the pyramid shapes 190 are etched by depositing and forming an etch mask 192 that has a pyramid shape. The pyramid outline of the masking material 192 may then be transferred into the absorber 188 by dry etching techniques such as, for example, reactive ion etching or ion beam milling. The height of the masking layer 192 may depend on the dry-etch selectivity between the masking material 192 and the material of the absorber 188. Suitable etch masks 192 may include photoresist, polymers such as benzo-cyclo-butene, and silicon dioxide. A pyramid shape may be formed in photoresist by gray scale lithography. A pyramid shape may be formed in non-photo-definable polymers by means of imprint lithography using a mold that has an inverted pyramid shape. A pyramid shape may be formed in silicon dioxide by using an additional thin mask layer having a square shape and then etching the silicon dioxide with an isotropic wet etchant.

Figure 19D:
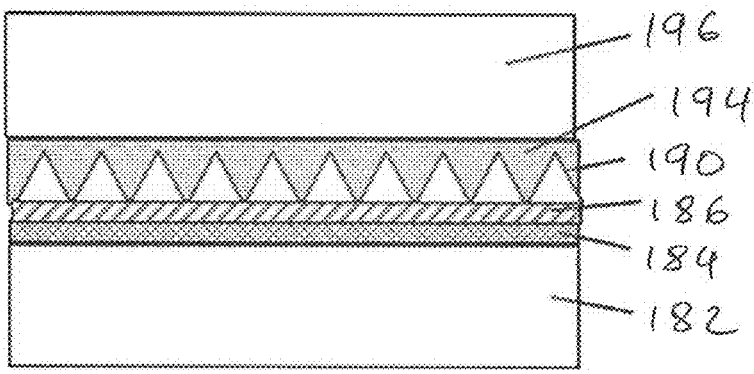

Referring to FIG. 19d, a material 194 is deposited in the spaces between the pyramids 190. In one exemplary embodiment, the material 194 may be composed of spin on glasses and various polymers. The material 194 may then be planarized. An optional adhesion layer (not shown) can be deposited on top of the planarized material 194. Then, a carrier substrate 196 is attached or bonded to the surface of the planarized material 194 or the adhesion layer (not shown). This process is used for wafer transfer.

Figure 19E:
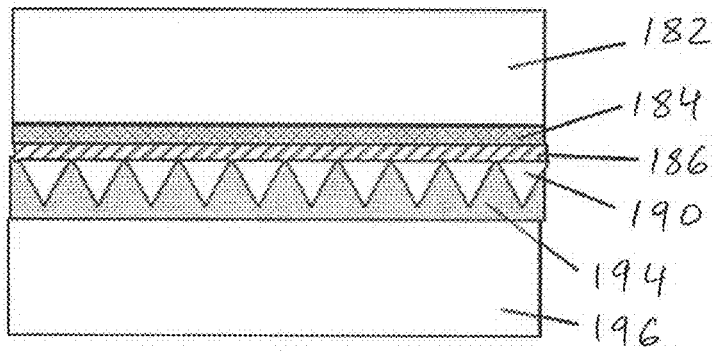
Figure 19F:
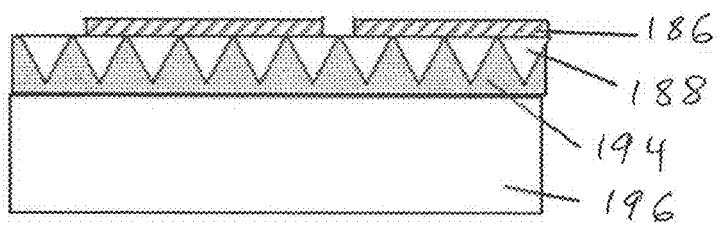

Referring to FIG. 19e, the structure shown in FIG. 19d is turned upside-down. Referring to FIG. 19f, the substrate 182 is removed or etched away as know in the art. The stop etch layer 184 facilitates this substrate 182's removal. The stop etch layer 184 is then also removed by known etching techniques, leaving the extractor layer 186 exposed. The extractor 186 may then be patterned by known photolithography and wet or dry etching methods. In fact, the exposed back side of the absorber layer 188 also can be etched. One exemplary embodiment that makes use of etching the absorber 188 from its back side. The back surface of the back-side etched extractor 186 and absorber 188 could have various shapes, including pyramid shapes, as discussed in detail above.

Figure 19G:
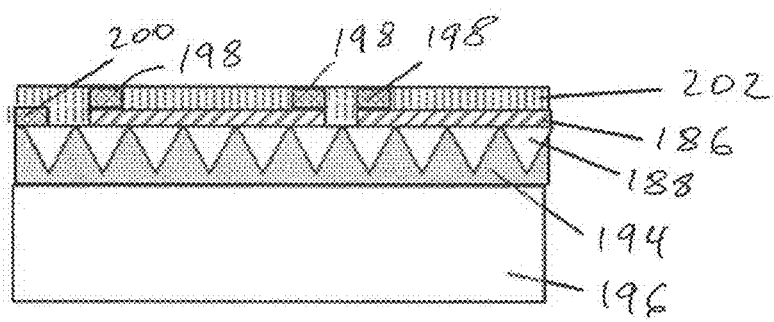

Referring to FIG. 19g, regions of ohmic-contact metals 198 and 200 are then deposited and patterned using exemplary techniques such as evaporation and lift-off or sputtering and etching. Both the ohmic-contact metals 198 for the extractor 186 and the ohmic-contact metal 200 for the absorber 188 may be deposited and patterned at the same time. Following the formation of the ohmic-contact metals 198 and 200, or in some exemplary embodiments, before the formation of the ohmic-contact metals 198 and 200, a film of dielectric passivation material 202 composed of, for example, silicon dioxide, polyimide or benzo-cyclo-butene material may be deposited on top of the structure. This passivation material 202 may serve to reduce the amount of surface recombination that occurs in the semiconductor material, and especially at the outer edges of PN junctions.

Figure 19H:
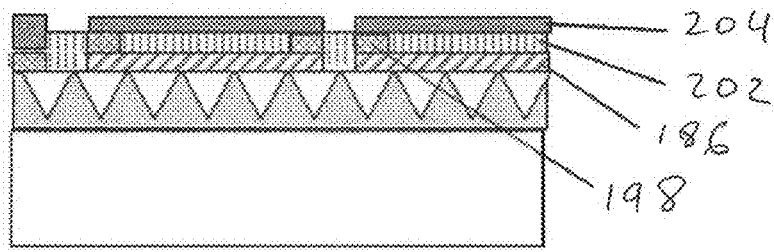

Referring to FIG. 19h, vias may be patterned and etched through the dielectric passivation material 202 to expose certain regions of or for the ohmic-contact metals 198 and 200. Metal bonding pads 204 may then be deposited and patterned. These metal bonding pads 204 can then be used for solder bump 205 bonding of the detector array to the read-out integrated circuit 210, as illustrated in FIGS. 19i-19l.

Figure 19I:
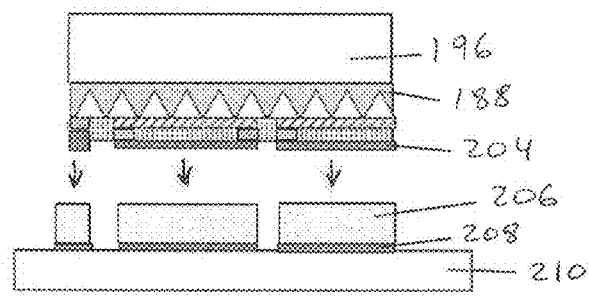
Figure 19J:
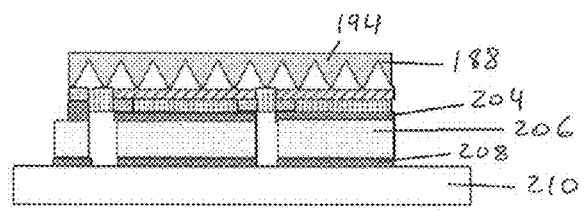
Figures 19K, 19L:
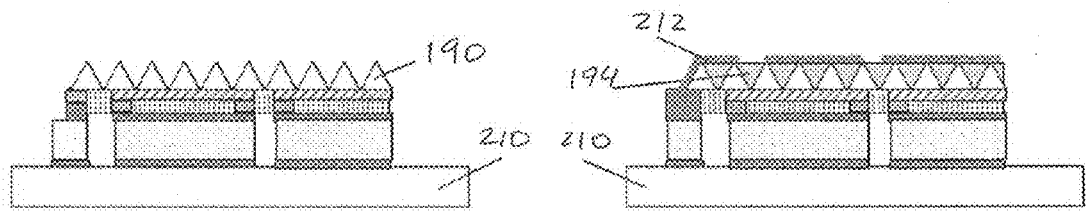

Referring to FIGS. 19i-19j, once the detector array, held on the carrier substrate 196, is bonded to the read-out integrated circuit 210, the carrier substrate 196 can then be removed. In one exemplary embodiment, a protective layer of material (not shown) such as photoresist may be used to cover and protect the read-out integrated circuit 210, the solder bumps 206 and the bond pads 204 and 208 from the etchant used to remove the carrier substrate 196. Referring to FIG. 19k, after the carrier substrate 196 is removed, the planarization/fill material 194 may optionally be removed and adhesion material (not shown) over the pyramids 190 can be removed. Referring to FIG. 19l, in one exemplary embodiment, ohmic contacts 212 may be formed on the tips of the pyramids 190 and additional metal interconnects can be deposited on patterned onto the now exposed top side of the detector array.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. Other embodiments are within the scope of the claims. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. An absorber of incident light comprising:
   a base layer; and
   a pyramidaly shaped absorbing material disposed above the base layer and configured to absorb an incident light and generate minority electrical carriers and majority electrical carrier,
   wherein the pyramidaly shaped absorbing material defines a plurality of holes within it.

2. A detector comprising:
   an extractor layer;
   an absorber layer disposed above the extractor layer;
   a first electrical contact; and
   a second electrical contact,
   wherein the absorber layer is configured to absorb photons of incident light and generate minority electrical carriers and majority electrical carriers;
   wherein the absorber layer is shaped as a pyramid and defines a plurality of holes within it, the extractor layer is electrically connected with the absorber layer and with the first electrical contact for extracting the minority electrical carriers, and the absorber layer is electrically connected with the extractor layer and with the second electrical contact to extract the majority electrical carriers.

3. The detector of claim 2, further comprising a base layer disposed between the extractor layer and the absorber layer, wherein the base layer is composed of the same material as the absorber layer.

4. The detector of claim 2, further comprising a read-out integrated circuit configured to process signals from the first electrical contact and the second electrical contact.

5. The detector of claim 2, further comprising a metal pad adjacent to the extractor layer, the metal pad configured to reflect incident light into the absorber layer.

6. The detector of claim 5 further comprising a dielectric buffer separating the absorber layer and the metal pad.

7. The detector of claim 2, wherein the absorber layer is shaped as a plurality of pyramids disposed adjacent to each other and each pyramid defines a plurality of holes within it.

8. The detector of claim 7, further comprising a plurality of extractor layers, wherein each pyramid in the plurality of pyramids is disposed directly above one of the extractor layers in the plurality of the extractor layers.

9. The detector of claim 8, further comprising a plurality of electrically interconnected contacts, wherein each contact in the plurality of electrically interconnected contacts is electrically connected with one of the extractor layers in the plurality of the extractor layers.

10. The detector of claim 2, wherein shape of the pyramid's base is square, rectangular, hexagon, triangular, circular, or elliptical.

11. The detector of claim 2, wherein the absorber layer comprises lightly doped n-type material or p-type material.

12. The detector of claim 2, wherein the extractor layer comprises p-type material and the absorber layer comprises n-type material, or the extractor layer comprises n-type material and the absorber layer comprises p-type material.

13. A detector comprising:
an extractor layer;
an absorber layer disposed above the extractor layer;
a first electrical contact; and
a second electrical contact,
wherein the absorber layer is configured to absorb photons of incident light and generate minority electrical carriers and majority electrical carriers;
wherein the absorber layer defines a plurality of holes within it, the extractor layer is electrically connected with the absorber layer and with the first electrical contact for extracting the minority electrical carriers, and the absorber layer is electrically connected with the extractor layer and with the second electrical contact to extract the majority electrical carriers.

14. The detector of claim 13, further comprising a base layer disposed between the extractor layer and the absorber layer, wherein the base layer is composed of the same material as the absorber layer.

15. The detector of claim 13, further comprising a read-out integrated circuit configured to process signals from the first electrical contact and the second 27, electrical contact.

16. The detector of claim 13, further comprising a metal pad adjacent to the extractor layer, the metal pad configured to reflect incident light into the absorber layer.

17. The detector of claim 16 further comprising a dielectric buffer separating the absorber layer and the metal pad.

18. The detector of claim 13, further comprising plurality of extractor layers.

19. The detector of claim 18, further comprising a plurality of electrically interconnected contacts, wherein each contact in the plurality of electrically interconnected contacts is electrically connected with one of the extractor layers in the plurality of the extractor layers.

20. The detector of claim 13, wherein the absorber layer comprises lightly doped n-type material or p-type material.

21. The detector of claim 13, wherein the extractor layer comprises p-type material and the absorber layer comprises n-type material, or the extractor layer comprises n-type material and the absorber layer comprises p-type material.

22. A method of detecting incident light, the method comprising:
providing an absorber layer defining a plurality of holes within it and configured to reduce reflection of an incident light and to absorb the photons of the incident light and generate minority electrical carriers and majority electrical carriers; and
providing an extractor layer for extracting the minority electrical carriers.

23. A method of claim 22, wherein the absorber layer is shaped as a pyramid.

24. A method of manufacturing a detector, the method comprising:
providing a substrate;
forming an extractor layer above the substrate;
forming an absorber layer above the extractor layer;
processing the absorber layer to form one or more holes;
providing a carrier substrate;
joining the carrier substrate with the absorber layer;
removing the substrate;
patterning the extractor layer to a predetermined shape;
forming one or more first metal contacts electrically contacted with the extractor layer; and
forming one or more second metal contacts electrically contacted with the absorber layer.

25. A method of claim 24, further comprising:
connecting the one or more first metal contacts and the one or more second metal contacts with a read-out integrated circuit; and
removing the carrier substrate.

26. A method of claim 24, further comprising:
etching the absorber layer to form one or more pyramidal shapes.

* * * * *